(12) United States Patent
Chen et al.

(10) Patent No.: US 11,469,752 B2
(45) Date of Patent: Oct. 11, 2022

(54) POWER DEVICE DRIVER AND METHOD

(71) Applicant: LEN Technology Limited, Jiangsu (CN)

(72) Inventors: Jingquan Chen, San Jose, CA (US); Chuan Ni, Plano, TX (US); Wei Lu, Shanghai (CN)

(73) Assignee: LEN Technology Limited, Jiangsu (CN)

( * ) Notice: Subject to any disclaimer, the term of this patent is extended or adjusted under 35 U.S.C. 154(b) by 212 days.

(21) Appl. No.: 16/860,810

(22) Filed: Apr. 28, 2020

(65) Prior Publication Data

US 2021/0258005 A1 Aug. 19, 2021

(30) Foreign Application Priority Data

Feb. 17, 2020 (CN) .......................... 202010122289.X (51) Int. Cl.
*H03K 17/082* (2006.01)
(52) U.S. Cl.
CPC ................ *H03K 17/0828* (2013.01)
(58) Field of Classification Search
CPC ............... H03K 17/082; H03K 17/08
See application file for complete search history.

(56) References Cited

U.S. PATENT DOCUMENTS

| 7,483,250 | B2 * | 1/2009 | Ishikawa | ............ | H03K 17/0828 |
| | | | | | 361/101 |
| 10,224,920 | B2 * | 3/2019 | Volke | ................... | H03K 17/166 |
| 2004/0120090 | A1 * | 6/2004 | Galli | ....................... | H02M 1/32 |
| | | | | | 361/115 |
| 2020/0144998 | A1 * | 5/2020 | Inoue | ................. | H03K 17/0828 |

\* cited by examiner

*Primary Examiner* — Scott Bauer
(74) *Attorney, Agent, or Firm* — Seed IP Law Group LLP (57) ABSTRACT

The present application provides a power device driver including a detection module coupled to the power device and configured to detect the state of the power device; a driving module coupled to the detection module and the power device respectively and configured to detect the power of the detection module. As a result, the power device is regulated; wherein the detection module includes a fast detection sub-module configured to detect a state of the power device within a preset time period after the input signal of the driving device is invalid, and controlling the driving module to softly turn off the power device when there is overcurrent. The present application also provides a corresponding power device driving method and electric equipment.

18 Claims, 5 Drawing Sheets

FIG. 5

POWER DEVICE DRIVER AND METHOD

BACKGROUND

Technical Field

This application relates to the field of electrical control, and in particular, to a driving device and method suitable for a power device.

Description of the Related Art

Power devices such as Insulated Gate Bipolar Transistors (IGBTs) have been widely used in fields such as motor drives, lighting circuits, inverters, traction drives, and the like. However, in practical applications, load short circuits often occur. In the case of a load short circuit, the IGBT conduction current will be very large. If the power device is not turned off in time, it will cause the device to overheat and eventually cause the device to be damaged.

When a short-circuit occurs in a load and an overcurrent power device (such as an IGBT) is to be turned off, the VCE may be excessively large under normal shutdown, thereby damaging the power device. Therefore, when the overcurrent device is turned off, a soft shutdown is generally adopted, that is, by reducing the driving voltage of the power device such as an IGBT transistor and reducing the driving capability of the driving circuit of the power device to reduce the voltage of VCE. The system or user can set a waiting time after the power device is soft turned off as needed to dissipate the heat generated by the overcurrent or wait for the cause of the overcurrent to disappear. During this waiting time, the overcurrent power device will not be turned on. After this waiting time, the power device resumes normal operation. When the load is short-circuited, the power device generally enters the saturation operating region. This protection method that enters soft shutdown and waits for a period of time is called desaturation protection (DESAT).

Figure 1:
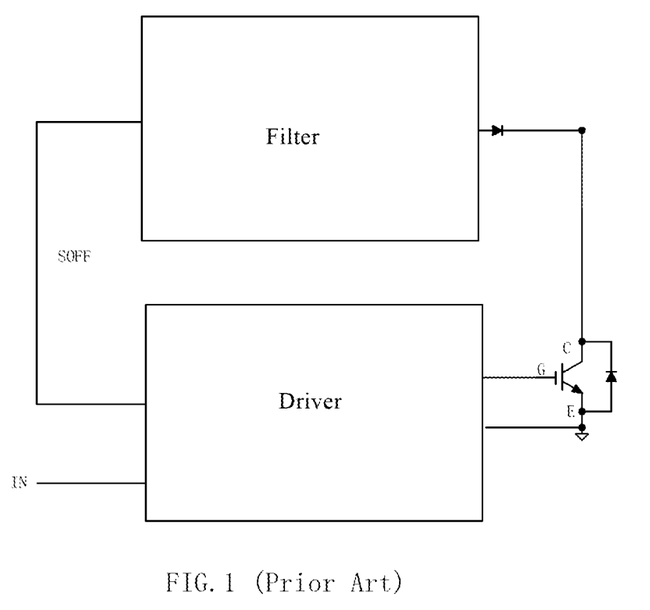
FIG. 1 is a structural diagram of a conventional power device driver.

FIG. 1 is a schematic block diagram of a known power device driver. As can be seen from the figure, the general device driver uses a filter to monitor the voltage VCE of the power device. If an overcurrent condition is detected, the soft-off signal SOFF can jump to become valid, so that the power device enters the soft-off by the drive module mode.

BRIEF SUMMARY

The present application provides a power device driver including a detection module coupled to the power device and configured to detect a state of the power device. A driving module is respectively coupled to the detection module and the power device, and configured to regulate the power device according to a detection result of the detection module. The detection module includes a rapid detection sub-module configured to control the power within a preset time period after the input signal of the driving device is inactive. The device status is detected, and the drive module is controlled to perform soft shutdown of the power device when the power device has an overcurrent.

In some embodiments, the detection module further includes a filtering sub-module configured to detect a state of the power device when the input signal is valid.

In some embodiments, the detection module further includes a current source coupled between the power supply and a first node in the rapid detection sub-module; and an OR gate coupled between the detection module and the drive module. It is configured to provide a control signal to the driving module according to the outputs of the fast detection sub-module and the filtering sub-module.

In some embodiments, the fast detection sub-module includes a first comparator, a first input of which is coupled to the first node and the first pole of the power device, and a second input of which is configured to receive a first threshold signal; the rapid detection sub-module further includes a first switch coupled between the first node and the filtering sub-module, and configured to be invalid when the input signal is within the preset time period, and disconnect the filtering sub-module from the power device.

In particular, the filtering sub-module includes a second node. The second node is coupled to the first node through the first switch, and is coupled to a ground potential through a second switch and a second comparator. A first input terminal is coupled to the second node, and the second input terminal is configured to receive a second threshold signal, and a capacitor is coupled between the second node and a ground potential.

In some embodiments, the driving device further includes a coupling diode whose anode is coupled to the fast detection sub-module and whose cathode is coupled to the first pole of the power device.

In some embodiments, the preset time period is less than or equal to 100 nanoseconds.

In some embodiments, the fast detection module further includes a control unit configured to make the fast detection module work within the preset time period or output a comparison result of the first comparator.

The present application also provides a driving method for a power device. The driving method includes determining whether an input signal of a power device driver is active. When the input signal fails, the driving method determines whether the input signal failure time is within a preset time period. When the input signal failure time is within a preset time period, the state of the power device is detected using non-filtering means to determine whether an overcurrent exists. When the overcurrent exists, the power device is soft-shutdown.

In some embodiments, the method further performs a hard shutdown of the power device when the input signal failure time exceeds a preset time period.

In some embodiments, the method further includes, when the input signal is valid, at least detecting a state of the power device by using a filtering method.

In some embodiments, the preset time period is less than or equal to 100 nanoseconds.

The present application also provides an electrical device including one or more power devices, and one or more of the foregoing driving devices. The driving devices are coupled to corresponding power devices to provide the power devices driving signals.

By adopting the technical solution provided in this application, the power device overcurrent phenomenon occurring within a preset time period when the input signal of the driving device becomes inactive can be more accurately captured, and the power device can be turned off in time in soft-shutdown mode, thus avoiding the situation of the power device being hard-shutdown improperly and damaged.

BRIEF DESCRIPTION OF THE DRAWINGS

Embodiments are shown and explained with reference to the drawings. These drawings serve to clarify the basic principles and thus show only the aspects necessary for understanding the basic principles. These drawings are not to scale. In the drawings, the same reference numerals denote similar features.

DETAILED DESCRIPTION

In the following detailed description, reference will be made to the accompanying drawings, which form a part hereof. The accompanying drawings show, by way of example, specific embodiments that can implement the present application. The exemplary embodiments are not intended to be exhaustive of all embodiments according to the present application. It will be understood by those of ordinary skill in the art that other embodiments may be used and structural or logical modifications may be made without departing from the scope of the present application. Therefore, the following detailed description is not restrictive, and the scope of the present application is defined by the appended claims.

Techniques, methods and equipment known to those of ordinary skill in the relevant art may not be discussed in detail, but where appropriate, the techniques, methods and equipment should be considered as part of the description. The connection between the units in the drawing is only for the convenience of description, which means that at least the units at both ends of the connection are in communication with each other, and it is not intended to limit the communication between the units that are not connected.

In the following detailed description, reference may be made to the accompanying drawings, which are included as part of the present application to explain specific embodiments of the present application. In the drawings, similar reference numbers describe generally similar components in different drawings. Each specific embodiment of the present application is described in sufficient detail below to enable a person having ordinary knowledge and technology in the art to implement the technical solution of the present application. It should be understood that other embodiments or structural, logical, or electrical changes to the embodiments of this application may also be used.

When the input signal of a power device driving circuit transitions from an active level to an inactive level, the driving circuit will quickly turn off the power device in a hard-shutdown mode. The inventors recognize that when an overcurrent occurs before the turning off, it may not be detected in time because the time constant of the filter in the overcurrent monitoring circuit is relatively long, for example, one microsecond, and it takes a long time to detect whether there is an overcurrent phenomenon. If the actual overcurrent that occurs at the input signal transition time is not detected and the power device is turned off in the hard-shutdown mode, the power device will be damaged.

In view of the above problems, this application proposes a dual-mode overcurrent protection method. It monitors overcurrent "VCE" when the input signal is valid, e.g., at an active level or asserted level, and quickly detects VCE within a preset time period/interval/duration after the input signal fails or becomes invalid, e.g., transitions from the active/asserted level to an inactive/de-asserted level, and switches to soft shutdown of the power device when overcurrent occurs to avoid power device overshoot or overvoltage damage. According to some embodiments, the active level of the input signal, or valid input signal, represents a command indicating that the power device is on, and the inactive level of the input signal, or invalid input signal, represents a command indicating that the power device is off. In the following description, for illustration purposes, a high voltage level of the input signal is taken as an active level or valid input signal and a low voltage level is taken as an inactive level or invalid input signal, for example, which does not limit the scope of the disclosure.

Figure 2:
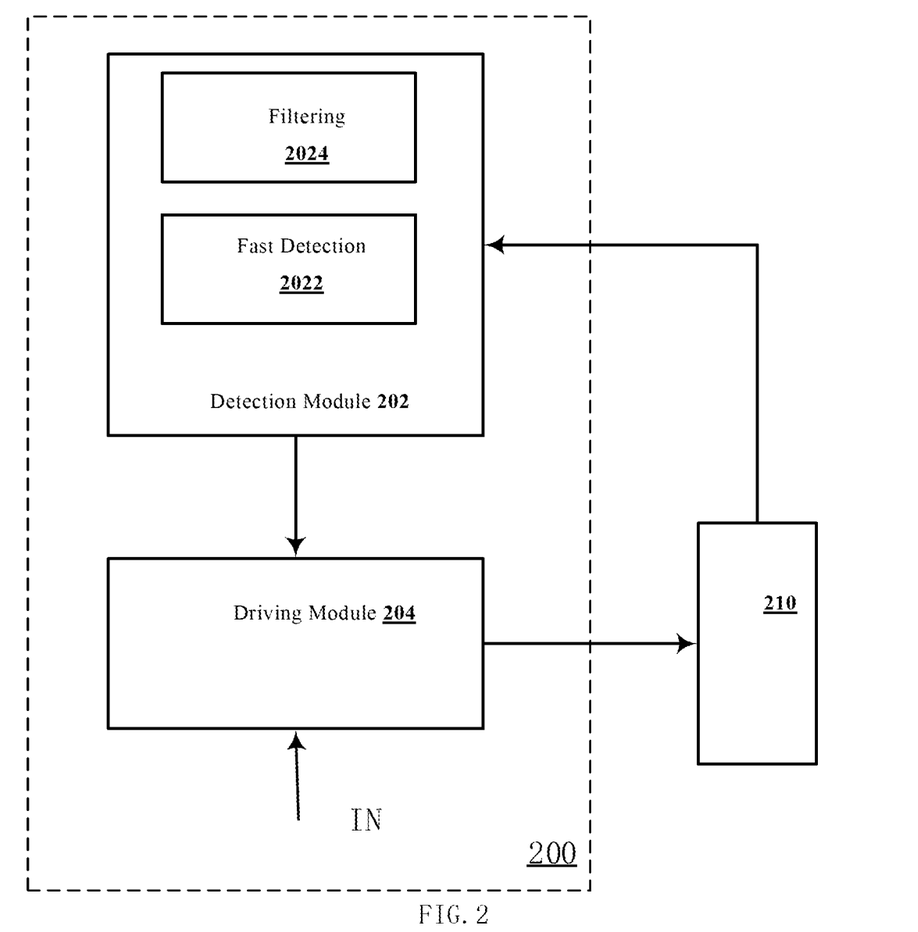
FIG. 2 is a structural diagram of a power device driver according to an embodiment of the present application.

FIG. 2 is a plan diagram of a driving device according to embodiments of the present application.

As shown, the driving device 200 is coupled to the power device 210 to provide a driving signal to the power device 210. According to some embodiments, the driving device 200 may include a detection module 202 and a driving module 204. The detection module 202 is used to detect a state of the power device 210, such as an IGBT transistor, a SiC MOSFET, a SiC power module having multiple SiC MOSFET devices, to generate a corresponding status signal, such as a soft-off signal SOFF, based on the state of the power device 210 and to provide the status signal to the driving module 204. The driving module 204 can drive the power device based on the status signal received from the detection module 202 and an input signal IN.

According to some embodiments, the detection module 202 includes a fast detection sub-module 2022, which performs rapid detection the state of the power device 210 within a preset period of time after the input signal IN to the driving module 204 becomes invalid, e.g., the input signal IN transitions from an active level to an inactive level. When the fast detection sub-module 2022 detects overcurrent in the preset period of time, the detection module 202 sends a soft-off signal to the driving module 204 for the driving module 204 to perform a soft shutdown of the power device 210. After the preset period of time has elapsed, if the input signal IN is still in the inactive state and no overcurrent has been detected, the power device can be turned off under the hard-shutdown mode.

According to some embodiments, the detection module 202 further includes a filtering sub-module 2024, configured to determine an overcurrent condition when the input signal IN is valid, and decide whether to soft-power off the power device.

The following description will be made by taking an example in which the power device is an IGBT transistor and the status signal is the voltage VCE of the IGBT transistor. Of course, those skilled in the art can understand that the solutions in this application can also be applied to other types of power devices or other status signals (such as current).

Figure 3:
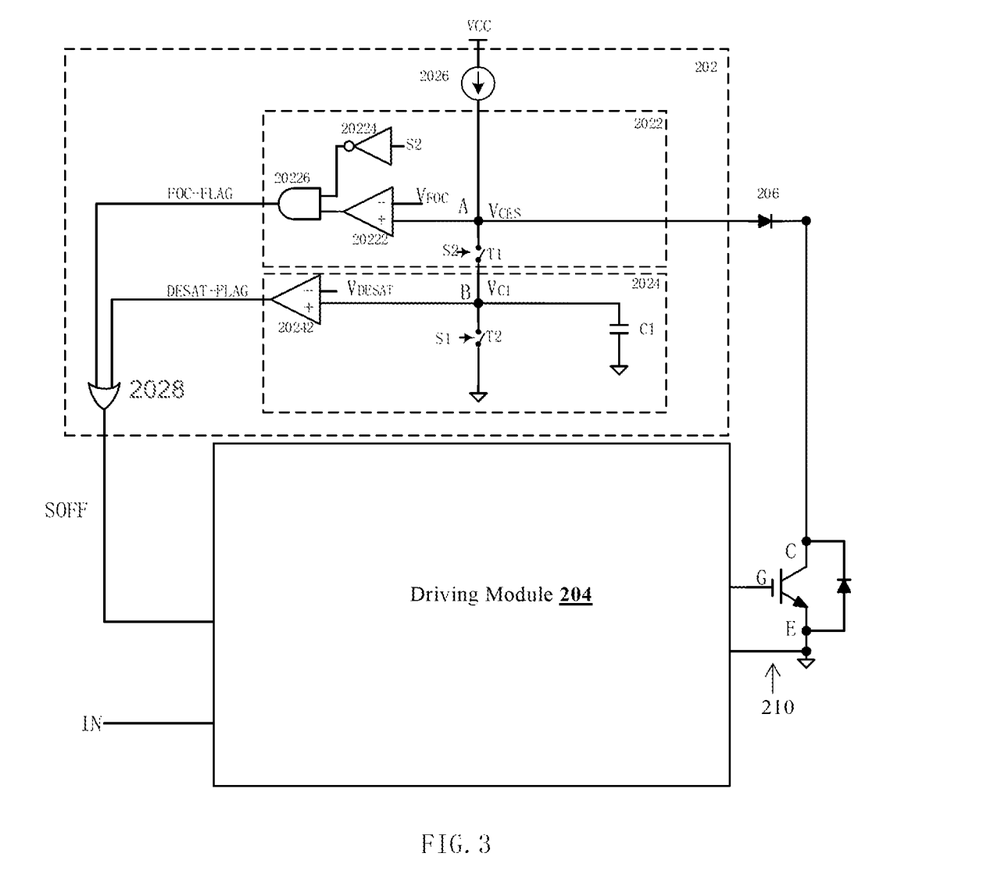
FIG. 3 is a schematic circuit diagram of a power device driver based on an embodiment of the present application.

FIG. 3 is a circuit diagram of a driving device according to embodiments of the present application. As shown, the driving device 200 may include a driving module 204 that is coupled to a power device 210, e.g., a control electrode G of an IGBT transistor 210 to provide a driving signal to the power device. According to some embodiments, the driving device 200 includes a detection module 202. According to some embodiments, the detection module 202 of the driving device 200 includes a diode 206 having an anode coupled to the input terminal of the detection module 202 and a cathode coupled to the first pole C of the IGBT transistor 210. When the IGBT transistor 210 is turned on and the $V_{CE}$ voltage is low, the diode 206 is conducting in the forward direction. As such, the voltage $V_{CE}$ can be obtained indirectly at the node A of the detection terminal, as voltage signal $V_{CES}$, which indirectly indicates the IGBT transistor 210 conduction current. When the $V_{CE}$ voltage is high, such as when the IGBT transistor is turned off or when a large current or short circuit occurs, the diode 206 is turned off, which ensures that overvoltage does not occur to the voltage $V_{CES}$ at the node A of the detection terminal.

According to some embodiments, the detection module 202 includes a fast detection sub-module 2022 and a filtering sub-module 2024. According to some embodiments, the detection module 202 further includes a current source 2026, which is coupled between the power source and the fast detection sub-module 2022. The detection module may further include an OR gate 2028, whose input is coupled to the outputs of the fast detection sub-module 2022 and the filtering sub-module 2024, and whose output is coupled to an input of the driving module 204 to provide a soft-off control signal SOFF.

According to some embodiments, the fast detection sub-module 2022 may include a comparator 20222, whose positive input receives the voltage $V_{CES}$ at node A related to $V_{CE}$, for example, $V_{CES}=V_{CE}+V_{threshold}$, where $V_{threshold}$ may be the threshold voltage of the diode 206. Node A is coupled to the anode of diode 206 and the positive input of comparator 20222 and the current source 2026. The negative input terminal of the comparator 20222 receives a reference voltage $V_{FOC}$. An output of the comparator 20222 is coupled to an input of the OR gate 2026.

According to some embodiments, the filtering sub-module 2024 may include a capacitor C1 and a comparator 20242. One end of the capacitor C1 is coupled to a ground potential, and the other end is coupled to a positive input terminal of the comparator 20242, or node B. The negative input of comparator 20242 can be used to receive $V_{DESAT}$. Other, various filter sub-module structures are also possible and can be used to replace the example structure of the filtering sub-module 2024 in FIG. 3. $V_{DESAT}$ and $V_{FOC}$ can choose different threshold values. For example, for the sake of anti-jamming, $V_{FOC}$ is set to be greater than $V_{DESAT}$; for another example, when the user's reserved power device has a small voltage withstand space, $V_{FOC}$ can be set to be less than $V_{DESAT}$ to ensure that the power devices 210 will not be damaged by overvoltages during the shutdown.

According to some embodiments, the node A in the fast detection sub-module 2022 is coupled to the node B in the filtering sub-module 2024 and the positive input terminal of the comparator 20242 through the switch T1 controlled by the signal S2. According to some embodiments, the node B is coupled to the ground potential through a switch T2 controlled by the signal S1.

According to some embodiments, the fast detection sub-module 2022 may further include a NOT gate 20224 and an AND gate 20226 configured to receive the signal S2. The AND gate 20226 is configured to receive an output of the NOT gate 20224 and an output of the comparator 20222, and the output of the AND gate 20226 can be used as an input of the OR gate 2026 as the FOC-FLAG, together with the output DESAT-FLAG of the filtering submodule 2024 as another input to the OR gate 2026. In this way, referring to FIG. 5, when S2 is low, for example, in a preset time period after the input signal IN transitions to an invalid signal, the output of the NOT gate 20224 is high, so during this time period, the output FOC-FLAG of the AND gate 20226 becomes high and the FOC-FLAG equals the output of the comparator 20222. Outside this preset period, S2 is high, so the output of NOT gate 20224 is low, and the output FOC-FLAG of the AND gate 20226 is also low.

According to some embodiments, the fast detection sub-module 2022 may include other units for controlling the working status of the fast detection sub-module 2022. For example, the comparator 20222 may be controlled so that it only operates during a preset period of time after the input signal IN transitions from the active level or valid to the inactive level or invalid. The comparator 20222 works for the preset period of time after the signal transition and does not work during other time periods. In some embodiments, a controller or a control logic 2030 controls the operation of the comparator 20222 to be functioning only within the preset period of time after the signal transition and does not work during other time periods.

Figure 4:
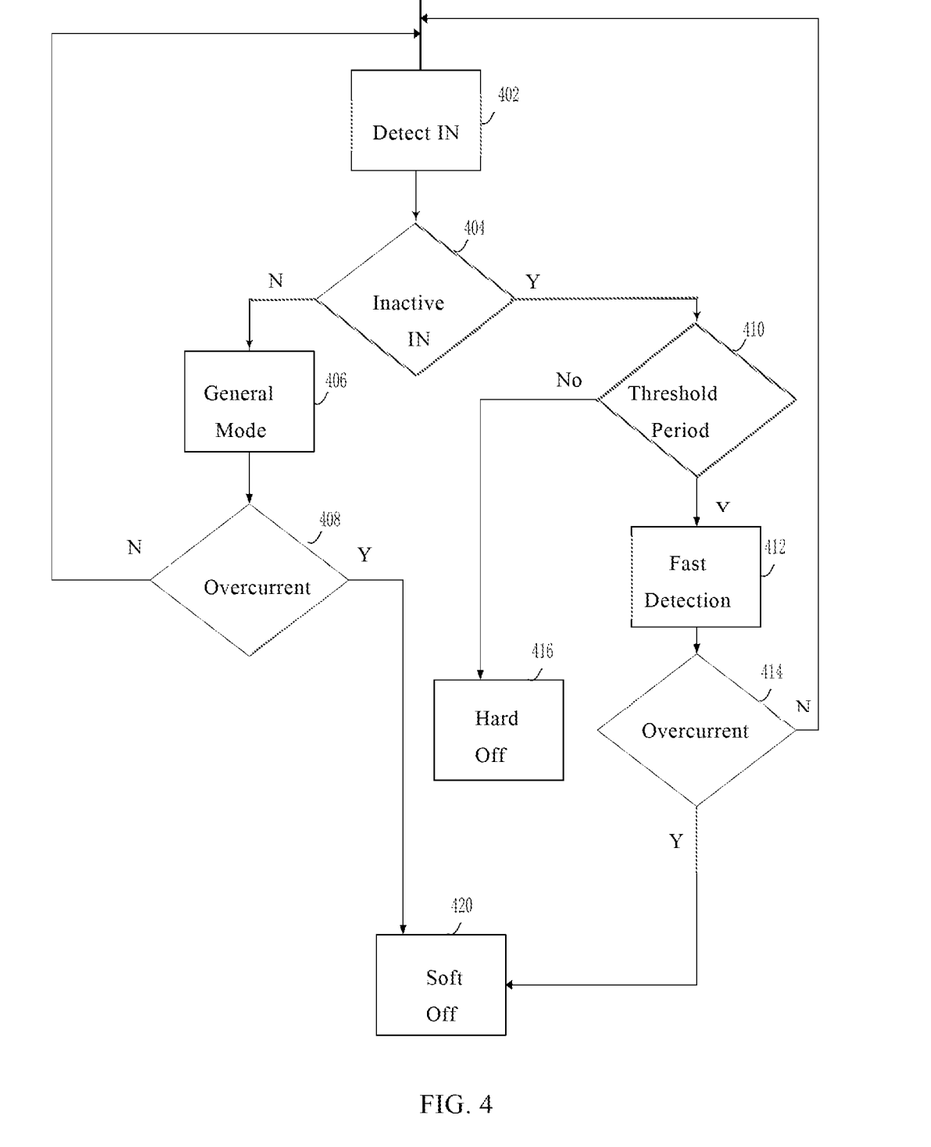
FIG. 4 is a flowchart of a power device driving method based on an embodiment of the present application.
Figure 5:
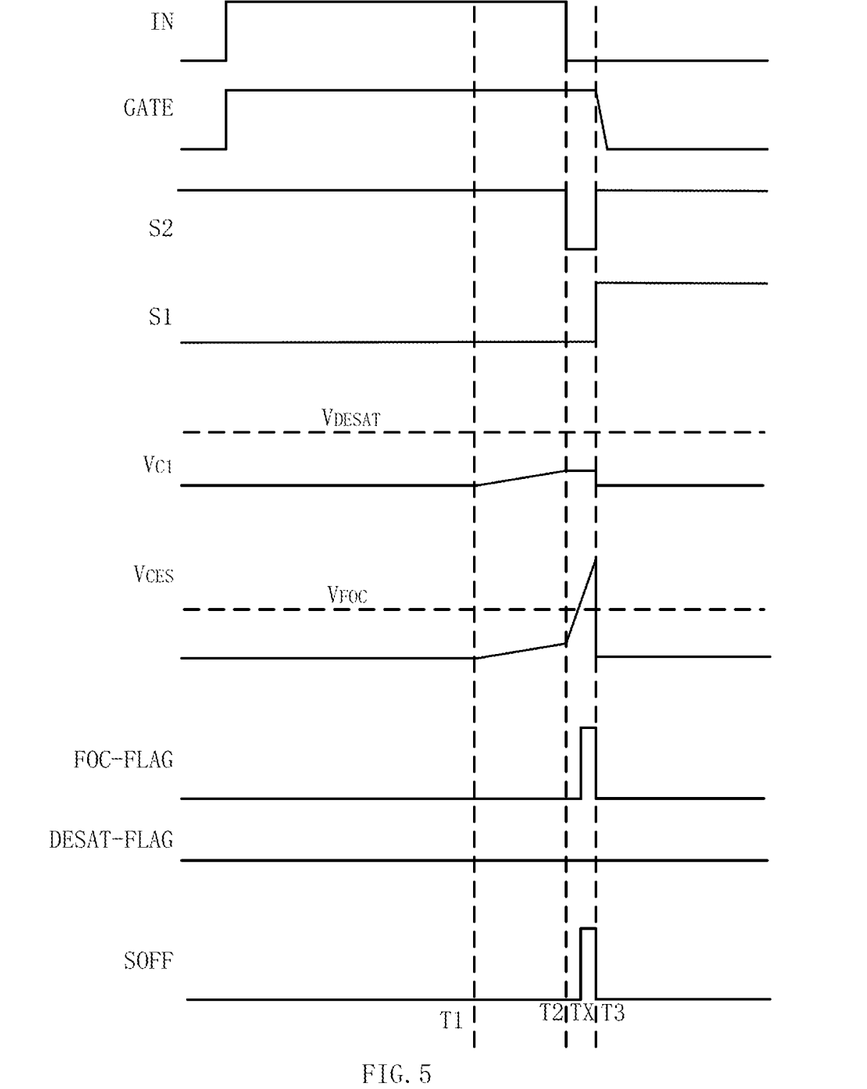
FIG. 5 is a timing diagram of the power device driver in FIG. 3.

FIG. 4 is a flowchart of a power device driving method according to some embodiments of the present application. FIG. 5 is a working timing diagram of a power device driving device according to some embodiments of the present application.

According to some embodiments, in step 402, an input signal IN of the driving device 200 may be detected, and in step 404, it is determined whether the input signal IN is valid, e.g., in an active level. For example, the status of whether the input signal IN is valid may be used to decide whether the fast detection sub-module 2022 should be enabled or the common filtering sub-module 2024 should be used to detect the power device 210.

When the input signal IN is at an active level, such as the high level shown in FIG. 5, in step 406, a general detection mode is adopted to detect a status signal representing a power device 210, such as the $V_{CE}$ of an IGBT transistor. According to some embodiments, the general detection mode may be implemented by, for example, a filtering sub-module 2024. For example, with respect to the example circuit of FIG. 3, in the general detection mode, switch T1 is turned on by the signal S2 and the switch T2 is switched off by the signal S1.

When the power device has an overcurrent condition as a result of the general detection mode, in step 408, the process jumps to step 420 to perform soft shutdown of the power device.

When the result of the general detection mode is that the power device 210 does not have an overcurrent condition, the detection is ended, or the process returns to step 402 to continue detecting the input signal IN at the next moment.

When the result obtained in step 404 is that the input signal IN is in an invalid state, it is determined in step 410 whether a period of time that the input signal IN is in the invalid state is still within a preset threshold time period. According to some embodiments, this preset threshold time period is a relatively short period of time, such as 100 nanoseconds or less.

When the period of time that the input signal IN is in the invalid state has exceeded the preset threshold time period, the power device 210 may be turned off in a hard-shutdown mode in step 416.

When the period of time that the input signal IN is in the invalid state is still within the preset threshold time period, it enters the fast detection mode in step 412, and determines in step 414 whether there is an overcurrent condition in the power device 210. For example, with respect to the example circuit of FIG. 3, in the fast detection mode, switch T1 is turned off by the signal S2, the switch T2 is switched on by the signal S1 and the comparator 20222 is enabled for operation. If there is an overcurrent condition in the power device 210, a soft shutdown of the power device 210 is performed on step 420; and if there is no overcurrent in the power device 210, the process skips to step 402 to detect the input signal IN at the next moment. During the fast detection mode, T2 can remain off as shown in FIG. 5 or be switched on to start the discharging of C1 earlier. The state of T2 can be chosen based on a timing to reset C1, which does not affect the fast detection because during the fast detection period, the comparator 20242 input signal ($V_{C1}$) is disconnected from $V_{CES}$, e.g., T1 is off.

FIG. 5 is a working timing diagram of the power device driving device in FIG. 3.

(1) Before T1

Before and including this stage, the input signal VIN is always at an active level, such as high level, so switch S2 is turned on, switch S1 is turned off, capacitor C1 is charged, and the connection potentials of node A and node B are both $V_{CES}$. At this stage, the IGBT transistor is in the on state, and the $V_{CE}$ voltage is very low. The diode 206 is turned on so that the voltage of $V_{CES}$ is similar to $V_{CE}$, so it is also in a low state.

(2) T1-T2 Period

Starting at T1, $V_{CE}$ gradually rises from the working potential, indicating that the power device has begun to experience an overcurrent phenomenon. However, during this period, the voltage $V_{CES}$ representing $V_{CE}$ is always smaller than $V_{FOC}$ and $V_{DESAT}$, indicating that the overcurrent condition of the power device is within an acceptable range. Therefore, at this stage, the inputs FOC-FLAG and DEASAT-FLAT of the OR gate 2028 are both low, and the output SOFF of the OR gate 2028 is also low.

(3) T2-T3 Period

At time T2, the input signal IN of the driving device jumps from the active level high level to the invalid level low level. At time T2, the switch S2 is turned off, the switch S1 remains off, and the fast detection sub-module starts to work.

At this stage, even if $V_{CE}$ continues to rise, due to the switch S2 being turned off and the presence of the capacitor C1, the voltage $V_{C1}$ of the node B remains unchanged and is always less than $V_{DESAT}$.

In contrast, the potential $V_{CES}$ at node A continues to rise with $V_{CE}$, and exceeds $V_{FOC}$ at TX time. Therefore, at TX time, the output of the comparator in the fast detection sub-module transitions from a low potential to a high potential. Therefore, the output signal SOFF of the OR gate also jumps to a high level at the time of TX. The power device is soft turned off at TX time.

(4) After T3

After time T3, the power device can be hard turned off, so the voltage
GATE of the power device, such as the gate of the IGBT, also gradually decreases from a high level to a low level. Therefore, both $V_{CES}$ and $V_{C1}$ are also pulled low at this moment.

At time T3, the switch S2 is turned on, and the switch S1 may also be turned on, thereby discharging the capacitor C1. The function of the switch S1 is to discharge the capacitor C1 when the IGBT transistor is turned off, thereby resetting the filtering sub-module.

According to different embodiments, the overcurrent state of the power device may be reflected by different parameters. For example, it can be assumed that the on-resistance of the power device is a fixed value, and the overcurrent status of the power device can be understood by detecting the $V_{CE}$ of the power device such as an IGBT transistor. Of course, for other power devices, a current level detection device may be provided. For such a power device, its overcurrent status can be determined by directly detecting its current level. The method and device provided in this application are not only applicable to the case where the overcurrent state is reflected by the $V_{CE}$, but also applicable to the case where other indicators are used to reflect the overcurrent state of the power device. That is, the thresholds corresponding to the state of the power device in this application may be voltage, current, and so on.

Using the circuit and method described in this embodiment, one can distinguish between general overcurrent and desaturation overcurrent, so as to select the corresponding protection mode in a targeted manner. Since the probability of de-saturation overcurrent occurring after a general overcurrent phenomenon occurs is relatively high, the solution in this embodiment can more accurately and timely capture the de-saturation overcurrent phenomenon and apply timely and effective protection to the power device.

With the technical solution provided by the present application, compared with the traditional detection method of filtering by reason, it is possible to more accurately capture the power device overcurrent that occurs within a preset time period when the input signal of the driving device becomes invalid. The power device is turned off in a timely manner, which avoids the situation that the power device is hard turned off during this time and the device is damaged.

Therefore, although the present application is described with reference to specific examples, which are intended to be exemplary only, and not to limit the present application, it will be apparent to one of ordinary skill in the art that without departing from the spirit and scope of the application, changes, additions, or deletions to the disclosed embodiments may be made.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a detection module configured to detect a state of a power device; and
   a driving module, respectively coupled to the detection module and the power device and configured to regulate the power device based on the state of the power device detected by the detection module and an input signal to the driving module,
   wherein the detection module includes:
      a fast detection sub-module configured to detect a state of overcurrent in the power device within a first period of time after the input signal of the driving module transitions from an active state to an inactive state and the driving module is configured to perform a soft shutdown of the power device based on the state of overcurrent detected by the fast detection sub-module within the first period of time;
      a filtering sub-module;

a current source coupled between a power source and a first node in the fast detection sub-module, the first node coupled to a terminal of the power device through a diode; and a first switch, coupled between the first node and the filtering sub-module, and configured to cut off the filtering sub-module from the power source when the input signal is inactive and within the first period of time.

2. The device according to claim 1, wherein the filtering sub-module is configured to detect a state of the power device when the input signal is at the active state.

3. The device according to claim 1, wherein the fast detection sub-module comprises a first comparator having a first input terminal coupled to the first node and a second input terminal configured to receive a reference signal.

4. The device according to claim 1, wherein the filtering sub-module comprises:
   a second node, the second node coupled to the first node through the first switch, and coupled to a ground potential through a second switch;
   a second comparator having a first input coupled to the second node, and a second input configured to receive a second reference signal; and
   a capacitor coupled between the second node and a ground potential.

5. The device according to claim 3, wherein the diode includes an anode coupled to the fast detection sub-module and a cathode coupled to the terminal of the power device.

6. The device according to claim 1, wherein the first period of time is less than or equal to 100 nanoseconds.

7. The device according to claim 3, wherein the fast detection sub-module further includes a control unit configured to cause the first comparator of the fast detection sub-module to work only within the first period of time.

8. An integrated circuit, comprising:
   detection circuitry configured to detect a state of a power device; and
   driving circuitry, coupled to the detection circuitry and configured to regulate the power device based on the state of the power device detected by the detection circuitry and an input signal to the driving circuitry,
   wherein the detection circuitry includes:
      a fast detection sub-circuitry configured to detect a state of overcurrent in the power device within a first period of time after the input signal of the driving device transitions from an active state to an inactive state and the driving circuitry is configured to perform a soft shutdown of the power device based on the state of overcurrent detected by the fast detection sub-circuitry within the first period of time;
      a filtering sub-circuitry;
      a current source coupled between a power source and a first node in the fast detection sub-circuitry the first node coupled to a terminal of the power device through a diode; and
      a first switch, coupled between the first node and the filtering sub-circuitry, and configured to cut off the filtering sub-circuitry from the power source when the input signal is inactive and within the first period of time.

9. The integrated circuit according to claim 8, wherein the filtering sub-circuitry is configured to detect a state of the power device when the input signal is at the active state.

10. The integrated circuit according to claim 8, wherein the fast detection sub-circuitry comprises a first comparator having a first input terminal coupled to the first node and a second input terminal configured to receive a reference signal.

11. The integrated circuit according to claim 8, wherein the filtering sub-circuitry comprises:
    a second node, the second node is coupled to the first node through the first switch, and is coupled to a ground potential through a second switch;
    a second comparator having a first input coupled to the second node, a second input configured to receive a second reference signal; and
    a capacitor coupled between the second node and the ground potential.

12. The integrated circuit according to claim 8, wherein the diode includes an anode coupled to the fast detection sub-circuitry and a cathode coupled to the terminal of the power device.

13. A device, comprising:
    a detection module configured to detect a state of a power device; and
    a driving module, respectively coupled to the detection module and the power device and configured to regulate the power device based on the state of the power device detected by the detection module and an input signal to the driving module,
    wherein the detection module includes:
       a fast detection sub-module configured to detect a state of overcurrent in the power device within a first period of time after the input signal of the driving module transitions from an active state to an inactive state and the driving module is configured to perform a soft shutdown of the power device based on the state of overcurrent detected by the fast detection sub-module within the first period of time; and
       a current source coupled between a power source and a first node in the fast detection sub-module, the first node coupled to a terminal of the power device through a diode,
       wherein the fast detection sub-module include:
          a first comparator having a first input terminal coupled to the first node and a second input terminal configured to receive a reference signal; and
          a control unit configured to cause the first comparator of the fast detection sub-module to work only within the first period of time.

14. The device according to claim 13, wherein the detection module includes a filtering sub-module configured to detect a state of the power device when the input signal is at the active state.

15. The device according to claim 13, further comprising a first switch, coupled between the first node and the filtering sub-module, and configured to cut off the filtering sub-module from the power source when the input signal is inactive and within the first period of time.

16. The device according to claim 13, wherein the filtering sub-module comprises:
    a second node, the second node coupled to the first node through the first switch, and coupled to a ground potential through a second switch;
    a second comparator having a first input coupled to the second node, and a second input configured to receive a second reference signal; and
    a capacitor coupled between the second node and a ground potential.

17. The device according to claim 13, wherein the diode includes an anode coupled to the fast detection sub-module and a cathode coupled to the terminal of the power device.

18. The device according to claim 13, wherein the first period of time is less than or equal to 100 nanoseconds.

* * * * *